United States Patent
Nam et al.

(10) Patent No.: US 10,969,601 B2
(45) Date of Patent: *Apr. 6, 2021

(54) COLOR SEPARATION DEVICES AND IMAGE SENSORS INCLUDING THE SAME

(71) Applicant: Samsung Electronics Co., Ltd., Suwon-si (KR)

(72) Inventors: Sunghyun Nam, Yongin-si (KR); Sookyoung Roh, Hwaseong-si (KR); Seokho Yun, Hwaseong-si (KR); Changgyun Shin, Anyang-si (KR); Hyungue Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/883,435

(22) Filed: May 26, 2020

(65) Prior Publication Data

US 2020/0285066 A1    Sep. 10, 2020

Related U.S. Application Data

(63) Continuation of application No. 16/557,113, filed on Aug. 30, 2019, now Pat. No. 10,725,310, which is a
(Continued)

(30) Foreign Application Priority Data

May 9, 2014    (KR) .................. 10-2014-0055752

(51) Int. Cl.
*G02B 27/42* (2006.01)
*G02B 27/10* (2006.01)
(Continued)

(52) U.S. Cl.
CPC ........... *G02B 27/42* (2013.01); *G02B 3/0056* (2013.01); *G02B 27/1013* (2013.01);
(Continued)

(58) Field of Classification Search
CPC ............... G02B 27/42; G02B 27/1013; G02B 27/4205; G02B 27/1086; G02B 3/0056;
(Continued)

(56) References Cited

U.S. PATENT DOCUMENTS 4,845,548 A    7/1989  Kohno et al.
5,982,545 A   11/1999  Su
(Continued)

FOREIGN PATENT DOCUMENTS

JP    2003-078917 A    3/2003
JP    2003-185819 A    7/2003
(Continued)

OTHER PUBLICATIONS

Seiji Nishiwaki et al., "Efficient colour splitters for high-pixel-density image sensors", Macmillan Publishers Limited, vol. 7. Mar. 2013, pp. 240-246.
(Continued)

*Primary Examiner* — Lin Ye
*Assistant Examiner* — Tuan H Le
(74) *Attorney, Agent, or Firm* — Harness, Dickey & Pierce, P.L.C.

(57) ABSTRACT

Color separation devices, and image sensors including the color separation devices and color filters, include at least two transparent bars that face each other with a gap therebetween. Mutually-facing surfaces of the at least two transparent bars are separated from each other by the gap such that the at least two transparent bars allow diffraction of visible light passing therebetween. The at least two trans-
(Continued)

parent bars have a refractive index greater than a refractive index of a surrounding medium.

36 Claims, 13 Drawing Sheets

Related U.S. Application Data continuation of application No. 14/707,272, filed on May 8, 2015, now Pat. No. 10,423,001.

(51) Int. Cl.
  *G02B 3/00* (2006.01)
  *H01L 27/146* (2006.01)
  *H04N 9/07* (2006.01)

(52) U.S. Cl.
  CPC ..... *G02B 27/1086* (2013.01); *G02B 27/4205* (2013.01); *H01L 27/14603* (2013.01); *H01L 27/14621* (2013.01); *H01L 27/14625* (2013.01); *H01L 27/14627* (2013.01); *H04N 9/07* (2013.01)

(58) Field of Classification Search
  CPC ......... H01L 27/14603; H01L 27/14621; H01L 27/14625; H01L 27/14627; H01L 27/14629; H04N 9/07; H04N 5/225; H04N 9/045; H04N 5/2254
  See application file for complete search history.

(56) References Cited

U.S. PATENT DOCUMENTS

| | | |
|---|---|---|
| 6,490,393 B1 | 12/2002 | Zhou et al. |
| 7,110,034 B2 | 9/2006 | Suda |
| 7,405,759 B2 | 7/2008 | Radl |
| 8,208,052 B2 | 6/2012 | Hiramoto et al. |
| 8,289,422 B2 | 10/2012 | Hiramoto et al. |
| 8,384,818 B2 | 2/2013 | Hiramoto et al. |
| 8,759,931 B2 | 6/2014 | Toshikiyo et al. |
| 8,767,114 B2 | 7/2014 | Hiramoto et al. |
| 8,941,200 B2 | 1/2015 | Egawa |
| 9,099,370 B2 | 8/2015 | Nishiwaki et al. |
| 2003/0179457 A1 | 9/2003 | Dobashi et al. |
| 2005/0200957 A1 | 9/2005 | Hikichi et al. |
| 2005/0213221 A1 | 9/2005 | Hoshuyama |
| 2006/0044429 A1 | 3/2006 | Toda et al. |
| 2007/0045685 A1 | 3/2007 | Yang et al. |
| 2007/0146531 A1 | 6/2007 | Toshikiyo |
| 2007/0221829 A1 | 9/2007 | Nakagawa et al. |
| 2008/0175519 A1 | 7/2008 | Nagumo |
| 2008/0290436 A1 | 11/2008 | Amicis et al. |
| 2010/0019129 A1 | 1/2010 | Ishigaki et al. |
| 2010/0176473 A1 | 7/2010 | Nishiwaki |
| 2010/0188537 A1 | 7/2010 | Hiramoto et al. |
| 2010/0214432 A1 | 8/2010 | Nakata et al. |
| 2011/0164156 A1 | 7/2011 | Hiramoto et al. |
| 2011/0192962 A1* | 8/2011 | Nishiwaki .............. H04N 9/045 250/226 |
| 2012/0013777 A1* | 1/2012 | Mao .................... H04N 5/3696 348/280 |
| 2012/0206637 A1 | 8/2012 | Hiramoto et al. |
| 2012/0280346 A1 | 11/2012 | Hung et al. |
| 2013/0099343 A1 | 4/2013 | Toshikiyo et al. |
| 2014/0055649 A1 | 2/2014 | Hiramoto et al. |
| 2014/0078355 A1* | 3/2014 | Hiramoto .......... H01L 27/14625 348/273 |
| 2014/0263968 A1 | 9/2014 | Nakamura et al. |
| 2015/0042850 A1 | 2/2015 | Bilcu et al. |
| 2015/0270298 A1 | 9/2015 | Lin et al. |

FOREIGN PATENT DOCUMENTS

| | | |
|---|---|---|
| JP | 2005-258053 A | 9/2005 |
| JP | 2008139618 A | 6/2008 |
| JP | 2012-015424 A | 1/2012 |
| JP | 2012-049620 A | 3/2012 |
| JP | 5325117 B2 | 10/2013 |
| JP | 2014-023118 A | 2/2014 |
| KR | 101007198 B1 | 1/2011 |
| KR | 10-1274591 B1 | 6/2013 |
| WO | WO-2014/034149 A1 | 3/2014 |

OTHER PUBLICATIONS

Japanese Office Action dated May 28, 2019 issued in corresponding Japanese Application No. 2015-095066.

Japanese Office Action issued by the Japanese Patent Office dated Jan. 14, 2020 of the Japanese Patent Application No. 2015-95066.

Korean Office Action dated Mar. 20, 2020 for KR Application No. 10-2014-0055752.

\* cited by examiner

COLOR SEPARATION DEVICES AND IMAGE SENSORS INCLUDING THE SAME

RELATED APPLICATION

This application is a continuation of U.S. application Ser. No. 16/557,113, filed on Aug. 30, 2019, which is a continuation of U.S. application Ser. No. 14/707,272, filed on May 8, 2015, now U.S. Pat. No. 10,423,001, which claims the benefit of, and priority, under 35 U.S.C. § 119, to Korean Patent Application No. 10-2014-0055752, filed on May 9, 2014, in the Korean Intellectual Property Office, the disclosure of which is incorporated herein in its entirety by reference.

BACKGROUND

1. Field

Example embodiments relate to color separation devices and image sensors including the same, and more particularly, to color separation devices capable of changing the propagation direction of incident light according to the wavelength of the light and an image sensor having improved light use efficiency due to use of the color separation devices and color filters.

2. Description of the Related Art

Generally, color displays and color image sensors respectively display multicolor images and detect colors of incident light by using color filters. Most of the currently used color displays, or color image sensors, use a RGB color filter format in which, for example, green filters are disposed in two of four pixels and blue and red filters are disposed in the two other pixels. In addition to the RGB color filter format, a CYGM color filter format in which complementary cyan, yellow, green, and magenta color filters are respectively disposed in four pixels is used.

However, because the color filters absorb all colors of light except for a filtered color, the light use efficiency of the color filters may be low. For example, because RGB color filters only transmit about ⅓ of incident light and absorb about ⅔ of the incident light, the light use efficiency of the RGB color filters is only about 33%. Therefore, most of the optical loss of the color displays, or color image sensors, is caused by the color filters.

Recently, attempts to use color separation devices instead of color filters have been made so as to improve the light use efficiency of the color displays, or color image sensors. The color separation devices may separate colors of incident light by using the diffraction or refraction characteristics of light which vary with the wavelength thereof, and colors separated by color separation devices may be provided to corresponding pixels. However, the current color separation devices do not provide clear colors compared to color filters.

SUMMARY

Example embodiments relate to color separation devices and image sensors including the same, and more particularly, to color separation devices capable of changing the propagation direction of incident light according to the wavelength of the light and an image sensor having improved light use efficiency due to use of the color separation devices and color filters.

According to some example embodiments, a color separation device includes at least two transparent bars facing each other with a gap therebetween, wherein mutually-facing surfaces of the at least two transparent bars are separated from each other by the gap such that the at least two transparent bars allow diffraction of visible light passing therebetween, and the at least two transparent bars have a refractive index greater than a refractive index of a surrounding medium.

Each of the at least two transparent bars may have a flat rectangular parallelepiped shape.

Each of the at least two transparent bars may have a height greater than a thickness thereof.

The at least two transparent bars may be formed of materials having different refractive indexes.

The at least two transparent bars may have a refractive index that varies in a height direction thereof.

Each of the at least two transparent bars may have a thickness of about 150 nm to about 300 nm and a height of about 500 nm to about 1 µm, and the gap between the at least two transparent bars may range from about 100 nm to about 1 µm.

Each of the at least two transparent bars may be formed of a material including at least one selected from $TiO_2$, $SiN_x$, ZnS, and ZnSe.

The mutually-facing surfaces of the at least two transparent bars may be parallel with each other.

Edges or center portions of the at least two transparent bars may extend perpendicularly to the mutually-facing surfaces and may be connected to each other.

Portions of the at least two transparent bars may be connected to each other, and perpendicularly intersect each other.

According to other example embodiments, an image sensor includes a first pixel row in which a plurality of first pixels detecting light having a first wavelength band are arranged; a second pixel row in which a plurality of second pixels detecting light having a second wavelength band and a plurality of third pixels detecting light having a third wavelength band are alternately arranged, the second pixel row being adjacent to the first pixel row; and a plurality of first color separation devices such as the color separation device respectively in the second pixels—the first color separation devices changing a spectrum distribution of incident light so as to increase a first proportion of light of the second wavelength band incident on the second pixels and a first proportion of light of the third wavelength band incident on the third pixels.

The image sensor may further include a plurality of first microlenses respectively on the first pixels; and a plurality of second microlenses respectively centered on the second pixels and extending to some regions of the third pixels on both sides of the second pixels.

Each of the first pixels may include a light detecting device converting incident light into an electric signal, a first color filter on the light detecting device and transmitting light having the first wavelength band, and a transparent spacer on the first color filter.

Each of second first pixels may include a light detecting device converting incident light into an electric signal, a second color filter on the light detecting device and transmitting light having the second wavelength band, and a transparent spacer on the second color filter.

Each of second third pixels may include a light detecting device converting incident light into an electric signal, a third color filter on the light detecting device and transmitting light having the third wavelength band, and a transparent spacer on the third color filter.

The first and second microlenses may be on the transparent spacers.

The first color separation devices may be buried in and fixed to the transparent spacers, the at least two transparent bars may have a refractive index greater than a refractive index of the transparent spacer.

The first color separation devices may transmit light of the second wavelength band in a forward direction toward the second pixels and may refract light of the third wavelength band to edges toward the third pixels on both sides of the second pixels.

The first wavelength band may be in a green band, the second wavelength band may be in a blue band, and the third wavelength band may be in a red band.

The first wavelength band may be in a green band, the second wavelength band may be in a red band, and the third wavelength band may be in a blue band.

The first and second pixel rows may be shifted relative to each other by half a width of the pixels thereof.

The first pixel row may further include fourth pixels detecting light having a fourth wavelength band, and the first pixels and the fourth pixels may be alternately arranged.

The first wavelength band may be in a magenta band, the second wavelength band may be in a cyan band, the third wavelength band may be in a yellow band, and the fourth wavelength band may be in a green band.

The first wavelength band may be in a magenta band, the second wavelength band may be in a yellow band, the third wavelength band may be in a cyan band, and the fourth wavelength band may be in a green band.

The image sensor may further include a plurality of second color separation devices that are respectively disposed in the third pixels, the second color separation devices may change a spectrum distribution of incident light so as to increase a second proportion of light of the third wavelength band incident on the third pixels and a second proportion of light of the second wavelength band incident on the second pixels.

The second color separation devices may transmit light of the third wavelength band in a forward direction toward the third pixels and may refract light of the second wavelength band to edges toward the second pixels on both sides of the third pixels.

The image sensor may further include microlenses on the first, second and third pixels, respectively.

According to further example embodiments, an image sensor includes a first pixel row in which a plurality of first pixels detecting light having a first wavelength band and a plurality of second pixels detecting light having a second wavelength band are alternately arranged; a second pixel row in which a plurality of first pixels detecting light having a first wavelength band and a plurality of third pixels detecting light having a third wavelength band are alternately arranged, the second pixel row being adjacent to the first pixel row; a plurality of first color separation devices respectively disposed in the second pixels, the first color separation devices changing a spectrum distribution of incident light so as to increase a proportion of light of the second wavelength band incident on the second pixels and a proportion of light of the first wavelength band incident on the first pixels; and a plurality of second color separation devices respectively in the third pixels, the second color separation devices changing a spectrum distribution of incident light so as to increase a first proportion of light of the third wavelength band incident on the third pixels and a first proportion of light of the first wavelength band incident on the first pixels.

The image sensor may further include a plurality of first microlenses respectively centered on the second pixels and extending to some regions of the first pixels on both sides of the second pixels; and a plurality of second microlenses respectively centered on the third pixels and extending to some regions of the first pixels on both sides of the third pixels.

The first color separation devices may transmit light of the second wavelength band in a forward direction toward the second pixels and may refract light of the first wavelength band to edges toward the first pixels disposed on both sides of the second pixels, and the second color separation devices may transmit light of the third wavelength band in a forward direction toward the third pixels and may refract light of the first wavelength band to edges toward the first pixels disposed on both sides of the third pixels.

The first wavelength band may be in a green band, the second wavelength band may be in a blue band, and the third wavelength band may be in a red band.

According to still yet other example embodiments, an image sensor a first pixel row in which a plurality of first pixels detecting light having a first wavelength band and a plurality of second pixels detecting light having a second wavelength band are alternately arranged; a second pixel row in which a plurality of first pixels detecting light having a first wavelength band and a plurality of third pixels detecting light having a third wavelength band are alternately arranged, the second pixel row being adjacent to the first pixel row; a plurality of first color separation devices respectively in the second pixels, the first color separation devices changing a spectrum distribution of incident light so as to increase a proportion of light of the second wavelength band incident on the second pixels and a first proportion of light of the first wavelength band incident on the first pixels; and a plurality of second color separation devices respectively in the first pixels of the second pixel row, the second color separation devices changing a spectrum distribution of incident light so as to increase a second proportion of light of the first wavelength band incident on the first pixels and a proportion of light of third wavelength band incident on the third pixels.

The image sensor may further include: a plurality of first microlenses respectively centered on the second pixels and extending to some regions of the first pixels on both sides of the second pixels in the first pixel row; and a plurality of second microlenses respectively centered on the first pixels of the second pixel row and extending to some regions of the third pixels on both sides of the second pixels.

The first wavelength band may be in a green band, the second wavelength band may be in a blue band, and the third wavelength band may be in a red band.

According to still yet other example embodiments, a color separation device includes a transparent pattern including at least one passage arranged so as to change a propagation direction of incident light passing through, wherein a refractive index of the transparent pattern is greater than a refractive index of a medium filling the at least one passage.

Dimensions of the at least one passage may be arranged so as to control color separation angles of visible light passing through.

The transparent pattern having at least one passage may allow diffraction of visible light passing through.

The transparent pattern may include a first transparent structure and a second transparent structure separated from each other by the at least one passage, and a first surface the first transparent structure may have point symmetry with respect to a first surface of the second transparent structure.

A refractive index of the first transparent structure and a refractive index of the second transparent structure may be each greater than the refractive index of the medium.

The first surface the first transparent structure may be parallel to the first surface of the second transparent structure.

BRIEF DESCRIPTION OF THE DRAWINGS

Example embodiments will be more clearly understood from the following detailed description taken in conjunction with the accompanying drawings.

FIG. 1 is a vertical cross-sectional view schematically illustrating the structure of a color separation device according to some example embodiments;

FIG. 2 is a horizontal cross-sectional view schematically illustrating the structure of the color separation device illustrated in FIG. 1;

FIG. 3 is a graph illustrating diffraction patterns of light according to the wavelength of the light passing through the color separation device illustrated in FIG. 1;

FIG. 4 is a graph illustrating diffraction angle variations according to a gap of the color separation device illustrated in FIG. 1;

FIGS. 5 and 6 are horizontal cross-sectional views schematically illustrating the structure of a color separation device according to other example embodiments;

FIG. 7 is a vertical cross-sectional view schematically illustrating the structure of a color separation device according to further example embodiments;

FIGS. 8 and 9 are horizontal cross-sectional views schematically illustrating the structures of color separation devices according to still yet other example embodiments;

FIG. 10 is a perspective view schematically illustrating the structure of a color separation device according to yet further example embodiments;

FIG. 11 is a plan view schematically illustrating a pixel structure of an image sensor according to some example embodiments;

FIG. 12 is a cross-sectional view of the image sensor taken along line b-b' of FIG. 11;

FIG. 13 is a cross-sectional view of the image sensor taken along line a-a' of FIG. 11;

FIG. 14 is a graph schematically illustrating color-separation spectrums by a color separation device illustrated in FIG. 11;

FIG. 15 is a plan view schematically illustrating a pixel structure of an image sensor according to other example embodiments;

FIG. 16 is a plan view schematically illustrating a pixel structure of an image sensor according to further example embodiments;

FIG. 17 is a plan view schematically illustrating a pixel structure of an image sensor according to still yet other example embodiments;

FIG. 18 is a plan view schematically illustrating a pixel structure of an image sensor according to yet further example embodiments;

FIG. 19 is a plan view schematically illustrating a pixel structure of an image sensor according to example embodiments;

FIG. 20 is a cross-sectional view of the image sensor taken along line a-a' of FIG. 19;

FIGS. 21 and 22 are graphs schematically illustrating color-separation spectrums respectively obtained by two color separation devices illustrated in FIG. 19;

FIG. 23 is a plan view schematically illustrating a pixel structure of an image sensor according to example embodiments;

FIGS. 24 and 25 are graphs schematically illustrating color-separation spectrums respectively obtained by two color separation devices illustrated in FIG. 23; and FIG. 26 is a plan view schematically illustrating a pixel structure of an image sensor according to example embodiments.

DETAILED DESCRIPTION

Figure 1:
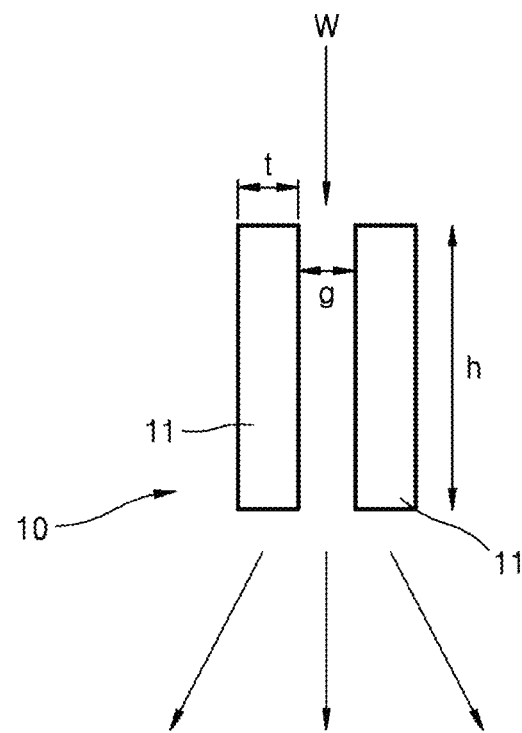
FIGS. 1-26 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, color separation devices and image sensors including the color separation device will be described in detail with reference to the accompanying drawings. In the drawings, like reference numbers refer to like elements, and also the size of each element may be exaggerated for clarity of illustration. The embodiments described herein are for illustrative purposes only, and various modifications may be made therefrom. In the following description, when an element is referred to as being "above" or "on" another element in a layered structure, it may be directly on the other element while making contact with the other element or may be above the other element without making contact with the other element.

Figure 2:
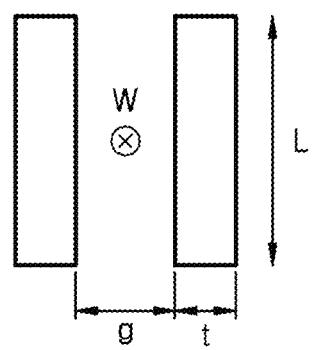

FIG. 1 is a vertical cross-sectional view schematically illustrating a color separation device according to some example embodiments, and FIG. 2 is a horizontal cross-sectional view schematically illustrating the color separation device 10 illustrated in FIG. 1.

Referring to FIGS. 1 and 2, a color separation device 10 of the current example embodiments may include two transparent bars 11 facing each other with a gap therebetween. Each of the transparent bars 11 may have a long flat rectangular parallelepiped shape (for example, a symmetric rectangular parallelepiped shape). In addition, mutually-facing surfaces of the two transparent bars 11 may be separated from each other such that visible light passing therebetween may be diffracted. Furthermore, the mutually-facing surfaces of the two transparent bars 11 may be parallel to each other.

In this structure, a portion of white light W incident on an upper side of the color separation device 10 may enter the two transparent bars 11 through upper surfaces thereof may exit the two transparent bars 11 through lower surfaces thereof. In addition, other portion of the white light W incident on the upper side of the color separation device 10 may be diffracted while passing between the two transparent bars 11. As generally known, the refraction angle and diffraction angle of light vary according to the wavelength of the light. Therefore, light refracted while passing through the two transparent bars 11 and light diffracted while passing between the two transparent bars 11 may propagate at different angles according to the wavelengths thereof when exiting the color separation device 10.

Figure 3:
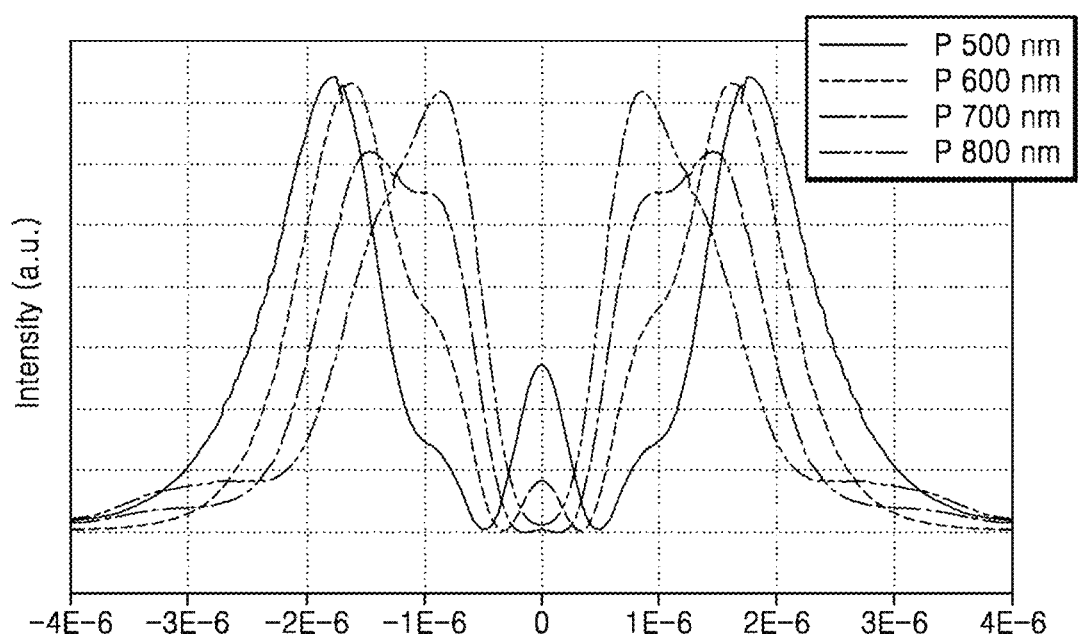

For example, FIG. 3 is a graph illustrating diffraction patterns of light passing through the color separation device according to the wavelength of the light.

In FIG. 3, the horizontal axis denotes a horizontal distance from a center axis of the color separation device 10 in meters (m), and the vertical axis denotes the intensity of light. The graph shown in FIG. 3 was obtained using a structure in which two $Si_3N_4$ transparent bars 11 having a thickness (t) of 200 nm and a height (h) of 620 nm were arranged within a range of 500 nm to 800 nm with a gap (g) of 100 nm therebetween.

As shown in the graph of FIG. 3, light with a relatively long wavelength has a relatively large diffraction angle and is thus relatively distant from the center axis of the color separation device 10, and light with a relatively short wavelength has a relatively small diffraction angle and is thus relatively close to the center axis of the color separation device 10. Therefore, color separation may be possible by using the color separation device 10 of the example embodiments.

Furthermore, in the case of the color separation device 10 of the current example embodiments, the thickness (t) and height (h) of the two transparent bars 11 and the gap (g) between the two transparent bars 11 may be varied to control color separation characteristics. For example, FIG. 4 is a graph illustrating diffraction angle variations when the gap (g) of the color separation device illustrated in FIG. 1 is varied.

Figure 4:
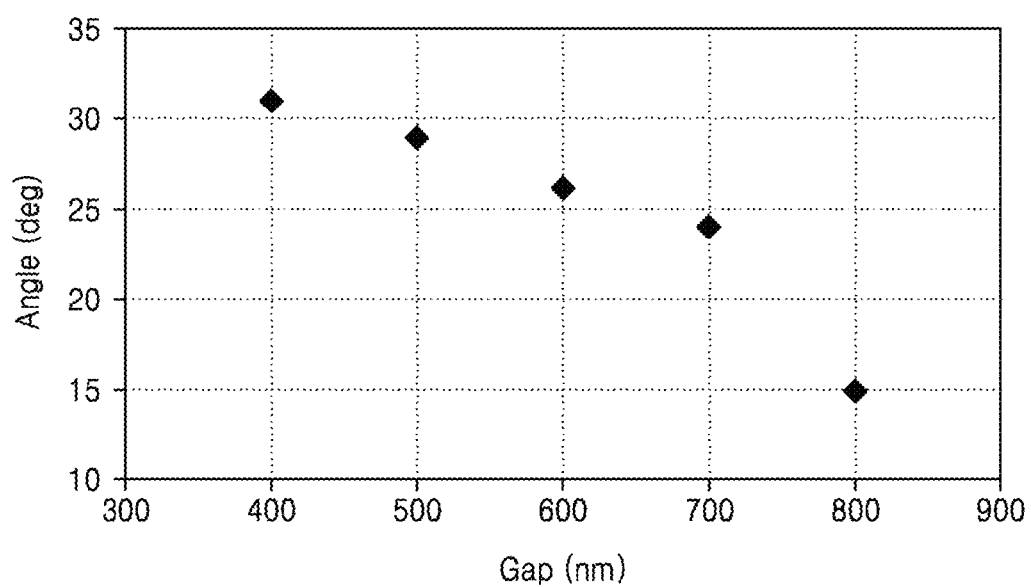

The graph shown in FIG. 4 was obtained using light of wavelength 630 nm while varying the gap (g) between two 200 nm thick, 620 nm high transparent bars 11 from 400 nm to 800 nm.

Referring to FIG. 4, when the gap (g) between the transparent bars 11 is 400 nm, the diffraction angle is about 30°, and when the gap (g) is 800 nm, the diffraction angle is about 15°.

Therefore, it is possible to propagate light passing through the color separation device 10 at a desired angle according to the wavelength of the light by adjusting the thickness (t) and height (h) of the two transparent bars 11 and the gap (g) between the two transparent bars 11. For example, the thickness (t) of the transparent bars 11 may be adjusted within the range of about 150 nm to about 300 nm, and the height (h) of the transparent bars 11 may be adjusted within the range of about 500 nm to about 1 μm. Therefore, the aspect ratio of the transparent bars 11 may be greater than 1. That is, the height (h) of the transparent bars 11 may be greater than the thickness (t) of the transparent bars 11. In addition, the gap (g) between the two transparent bars 11 may be adjusted within the range of about 100 nm to about 1 μm. The length (L) of the transparent bars 11 may not have a significant effect on color separation characteristics of the color separation device 10.

When the color separation device 10 is used in an image sensor, the color separation device 10 may be configured to optimize the propagation angle of light according to the distance between a light exit surface of the color separation device 10 and the image sensor, the pixel pitch of the image sensor, the distance between a pixel directly facing the color separation device 10 and a pixel corresponding to a wavelength of light separated by the color separation device 10, etc. For example, one of the gap (g) between the transparent bars 11 and the thickness (t) and height (h) of each of the transparent bars 11 may be determined in such a manner that a wavelength of light separated by the color separation device 10 may propagate from the color separation device 10 and may be concentrated in a certain region of a pixel corresponding the wavelength of the light within a predetermined distance from a center of the pixel (for example, about several micrometers (μm) according to the size of the pixel) in a predetermined amount or more (for example, about 60% or more) of the total quantity of the wavelength of the light.

The transparent bars 11 may be disposed in and fixed to a spacer formed of a transparent material (e.g. silicon dioxide ($SiO_2$, n=1.46)). In this case, the transparent bars 11 may be formed of a dielectric material having a refractive index greater than a refractive index of a surrounding medium. For example, the transparent bars 11 may be formed of a material such as $TiO_2$ (n=2.3 to 2.5), $SiN_x$ (n=2), ZnS (n=2.4), or ZnSe (n=2.5). The transparent bars 11 may be formed of a transition metal chalcogenide, or a transition metal oxide. The metal transition chalcogenide may be MSe, MS or MTe wherein M represents a metal. The two transparent bars 11 may be formed of the same material, or materials having different refractive indexes. In addition, each of the transparent bars 11 may have a constant refractive index, or a refractive index, varying in the propagation direction of light, that is, in the direction of height (h) as shown in FIG. 1. For example, each of the transparent bars 11 may have a refractive index gradually increasing, or decreasing, in the propagation direction of light, or a plurality of discrete refractive indexes in the propagation direction of light.

Such color separation devices 10 may be disposed, for example, in pixels of an image sensor for improving the light use efficiency of the image sensor. In general, pixels of an image sensor are very small, and the distance between a light entrance surface and a light detecting device is very short. However, because color separation devices having a simple single structure require a long distance for color separation, crosstalk may easily occur, and such color separation devices are not suitable for use in an image sensor having small pixels. In addition, color separation devices of the related art capable of separating colors within a short distance have complicated structures, and thus, it is difficult to use such color separation devices of the related art due to manufacturing difficulties. For example, because such color separation devices of the related art have slopes or asymmetric structures, it is difficult to manufacture the color separation devices through standard processes such as thin-film deposition and etching, or patterning.

According to the current example embodiments, however, the color separation device 10 has a symmetric structure and thus may be manufactured through standard processes, and color separation is possible within a short distance owning to a combined structure of the two transparent bars 11. In addition, because color separation angles are controllable by adjusting the dimensions of the two transparent bars 11, effective color separation is possible. Therefore, if the color separation device 10 is used in an image sensor, the angle of diffraction may be controlled in accordance with various design specifications, and thus the pixels of the image sensor may be designed more easily.

Figure 5:
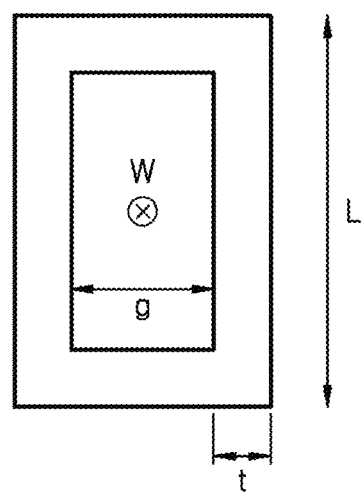
Figure 6:
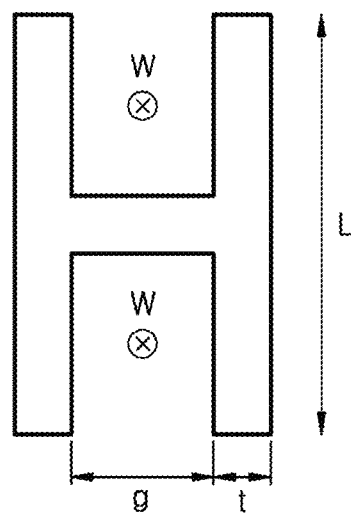

In the current example embodiments, the two transparent bars 11 of the color separation device 10 may be completely separated from each other as shown in FIG. 2. However, the example embodiments are not limited thereto. For example, as shown in FIG. 5, the two transparent bars 11 may be connected to each other through edges thereof extending perpendicular to the mutually-facing surfaces thereof. In this case, the color separation device 10 may have a rectangular box shape. In other example embodiments, as shown in FIG. 6, the two transparent bars 11 may be connected to each other through center portions thereof extending perpendicular to the mutually-facing surfaces. In this case, the color separation device 10 may have an H beam shape.

As described above, the color separation device 10 includes the two transparent bars 11 facing each other. However, the number of the transparent bars 11 is not limited to two. For example, three or more transparent bars 11 may be arranged in parallel to each other. For example, FIG. 7 is a vertical cross-sectional view schematically illustrating a color separation device including three transparent bars according to other example embodiments.

Figure 7:
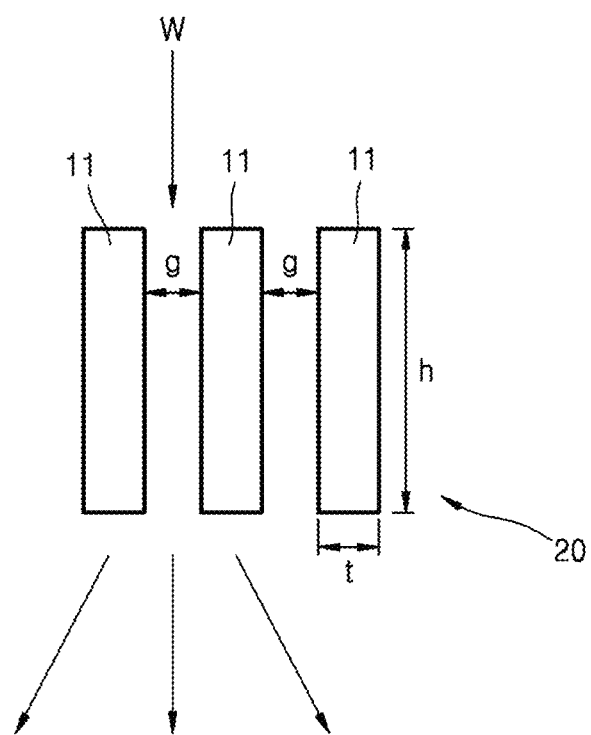

As shown in FIG. 7, three transparent bars 11 may have the same shape, and may be arranged in parallel to each other at regular intervals. However, if necessary, the three transparent bars 11 may have different thicknesses (t) and heights (h) and may be arranged with different gaps (b) therebetween.

Figure 8:
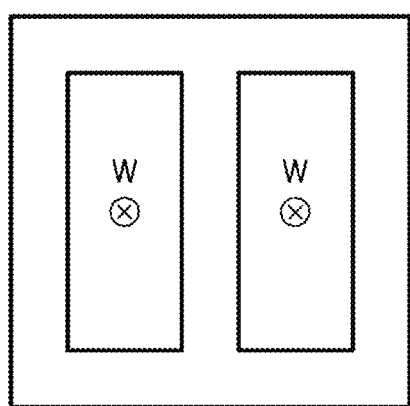
Figure 9:
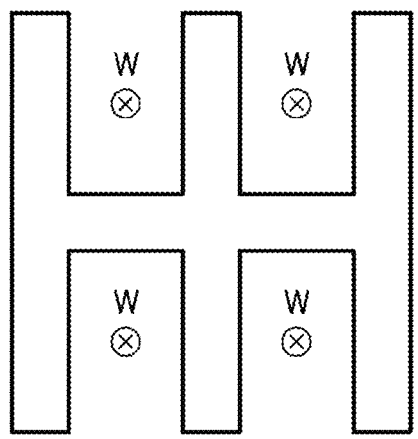

In addition, the three transparent bars 11 may be completely separated from each other. However, the arrangement of the transparent bars 11 is not limited thereto. For example, the three transparent bars 11 may be connected to each other through edges thereof extending perpendicular to mutually facing surfaces thereof as shown in a horizontal cross-sectional view of FIG. 8, or through center portions extending perpendicular to the mutually-facing surfaces as shown in a horizontal cross-sectional view of FIG. 9.

Figure 10:
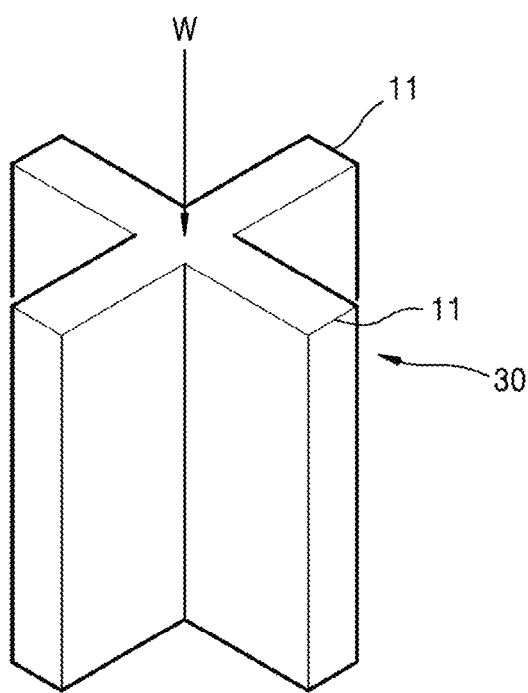

FIG. 10 is a perspective view schematically illustrating a structure of a color separation device according to further example embodiments.

Referring to FIG. 10, a color separation device 30 may have a structure in which two transparent bars 11 are connected to each other through perpendicularly crossing portions. In the example shown in FIG. 10, center portions of the two transparent bars 11 cross each other. However, the arrangement of the transparent bars 11 is not limited thereto. For example, edge portions of the two transparent bars 11 may cross each other. In this structure, color separation characteristics of the color separation device 30 may be controlled by adjusting the thickness (t), height (h), and crossing position of the transparent bars 11, and diffraction may occur at the rest portions of the transparent bars 11 that do not cross each other.

Hereinafter, image sensors in which the above-described color separation devices 10, 20, and 30 are used together with color filters for improving the light use efficiency of the image sensors will be described in detail according to various embodiments.

Figure 11:
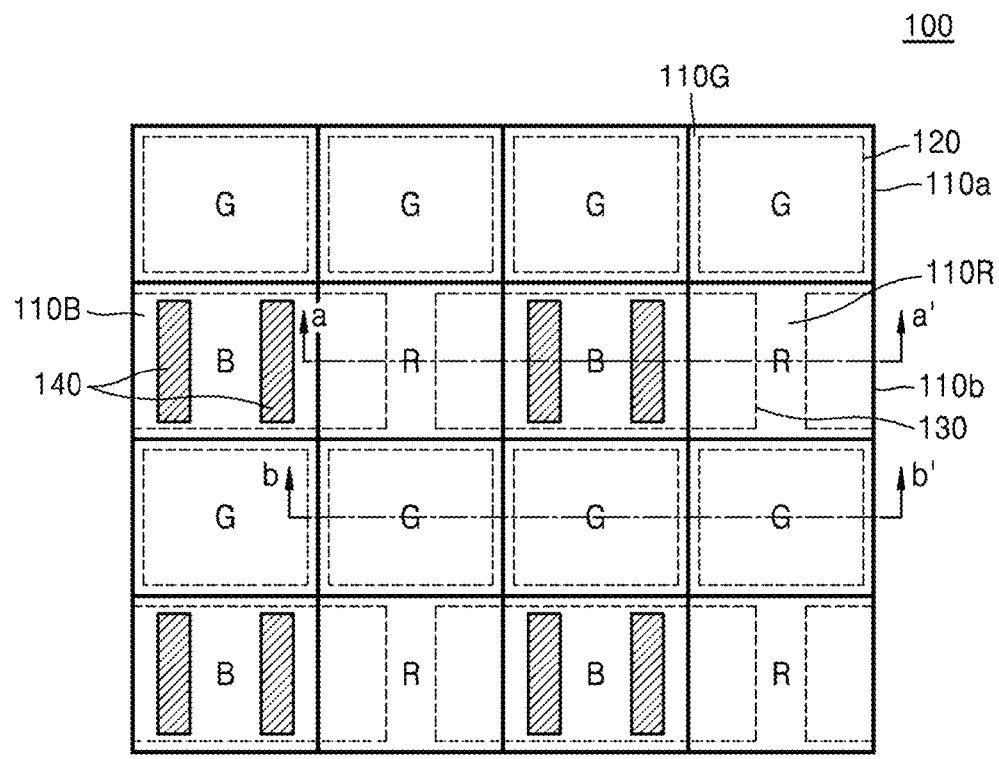

First, FIG. 11 is a plan view schematically illustrating a pixel structure of an image sensor according to example embodiments.

Referring to FIG. 11, an image sensor 100 may include a pixel array including a plurality of light detecting pixels 110R, 110G, and 110B which are arranged in a two-dimensional matrix having a plurality of rows and columns. For example, as shown in FIG. 11, only green pixels 110G may be arranged in a first pixel row 110a. In addition, red pixels 110R and blue pixels 110B may be alternately arranged in a second pixel row 110b adjacent to the first pixel row 110a. Such first pixel rows 110a and second pixel rows 110b may be alternately arranged in a vertical direction.

Figure 12:
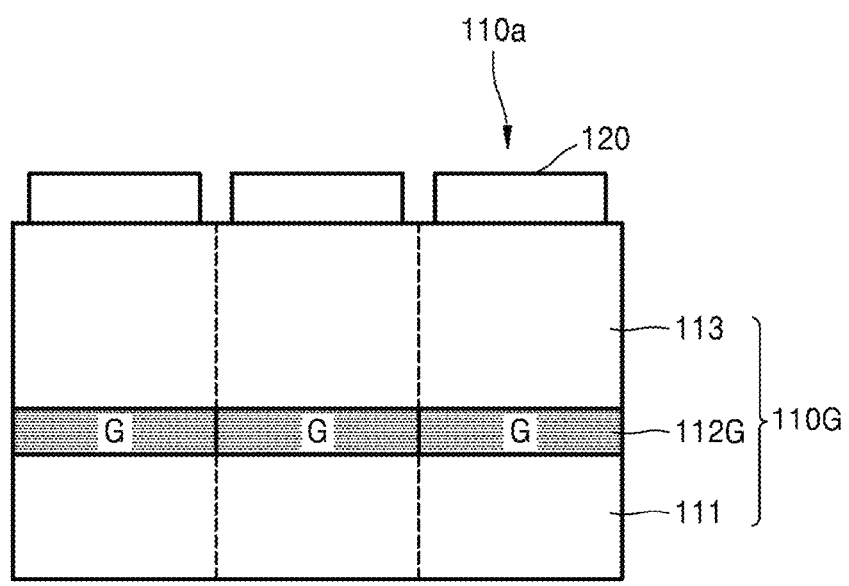

FIG. 12 is a cross-sectional view of a first pixel row of the image sensor, taken along line b-b' of FIG. 11.

Referring to FIG. 12, a first pixel row 110a may include a plurality of light detecting devices 111 arranged adjacent to each other, a plurality of green color filters 112G respectively disposed on light entrance surfaces of the light detecting devices 111, a transparent spacer 113 disposed on all (or each) of the green color filters 112G, and a plurality of microlenses 120 respectively disposed on the transparent spacer(s) 113 to concentrate incident light on the light detecting devices 111. Each of the light detecting devices 111, each of the green color filters 112G, and the transparent spacer 113 may constitute a single green pixel 110G. Each group consisting of one of the light detecting devices 111, one of the green color filters 112G, and the transparent spacer (or one of the transparent spacers) 113 may constitute a single green pixel 110G. According to other example embodiments, the transparent spacer 113 may extend across all of the green filters 112G.

In this structure, the microlenses 120 may focus incident light on the corresponding light detecting devices 111 through the transparent spacer 113 and the green color filters 112G. The green color filters 112G may be arranged to respectively correspond to the light detecting devices 111. However, in other example embodiments, a long single green color filter 112G may be disposed across all of the light detecting devices 111. Because only the green color filters 112G are disposed in the first pixel rows 110a, only a green band of incident light may pass through the green color filters 112G and reach the light detecting devices 111. The light detecting devices 111 convert incident light into an electric signal according to the intensity of the incident light. Therefore, only green light may be detected by the first pixel rows 110a.

Figure 13:
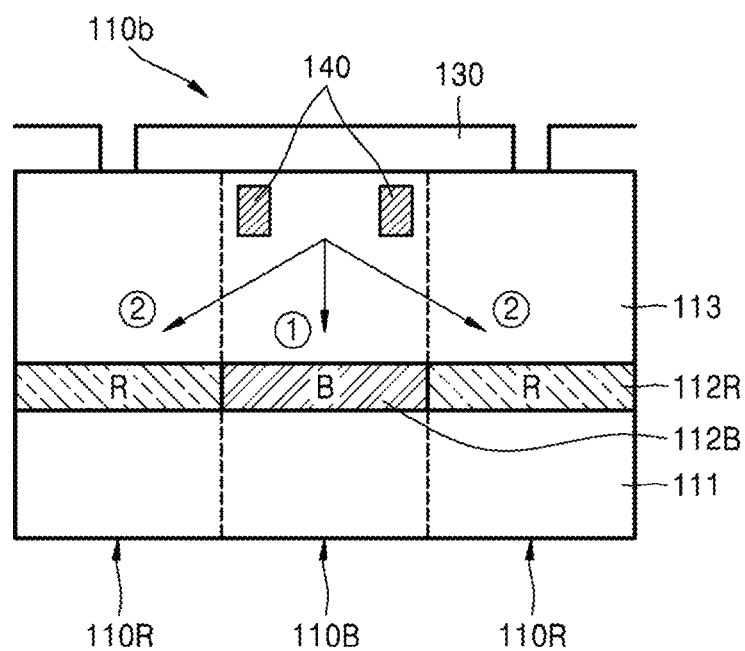

FIG. 13 is a cross-sectional view of a second pixel row of the image sensor, taken along line a-a' of FIG. 11.

Referring to FIG. 13, a second pixel row 110b may include a plurality of light detecting devices 111 arranged adjacent to each other; a plurality of red color filters 112R and a plurality of blue color filters 112B that correspond to the red pixels 110R and the blue pixels 110B and are alternately arranged on light entrance surfaces of the light detecting devices 111; a transparent spacer 113 disposed on all (or each) of the red color filters 112R and the blue color filters 112B; a plurality of color separation devices 140 disposed in the transparent spacer 113 to face the blue color filters 112B; and a plurality of microlenses 130 disposed on the transparent spacer 113 to concentrate incident light on the respective light detecting devices 111. Some of the light detecting devices 111, the blue color filters 112B, and the transparent spacer 113 may constitute the blue pixels 110B, and the other of the light detecting devices 111, the red color filters 112R, and the transparent spacer 113 may constitute the red pixels 110R. According to other example embodiments, the transparent spacer 113 may extend across all of the red color filters 112R and the blue color filters 112B. The color separation devices 140 may be buried in the transparent spacer 113 so that the color separation devices 140 are fixed in and surrounded by the transparent spacer 113.

As shown in FIG. 13, each of the microlenses 130 may extend from a region of a blue pixel 110B to some regions of red pixels 110R disposed on both sides of the blue pixel 110B. In the first pixel rows 110a, each of the microlenses 120 is disposed in a single green pixel 110G. In the second pixel rows 110b, however, each of the microlenses 130 is centered on a blue pixel 110B and extends to about halves of red pixels 110R located on both sides of the blue pixel 110B. That is, the width of the microlenses 130 of the second pixel rows 110b may be about two times the width of the microlenses 120 of the first pixel rows 110a. Therefore, light incident on all of the blue pixels 110B and some regions of the red pixels 110R located on both sides of the blue pixels 110B may be concentrated by the microlenses 130 and may pass through the color separation devices 140.

As shown in FIGS. 11 and 13, each microlens 130 may correspond to one color separation device 140. Therefore, light concentrated while passing through one microlens 130 may be separated according to the wavelength thereof while passing through a color separation device 140 corresponding to the one microlens 130, and the light separated according to the wavelength thereof may be incident on pixels 110B and 110R corresponding to wavelengths separated from the light. To this end, the color separation device 140 separates colors by changing the propagation direction of incident light according to the wavelength of the incident light based on the diffraction or refraction characteristics of light varying according to the wavelength of the light. For example, the color separation device 140 may be one of the color separation devices 10, 20, and 30 described with reference to FIGS. 1 to 10. In the current example embodiments, the color separation device 140 may be configured to change the spectrum distribution of incident light in such a manner that the proportion of blue in light directed to the blue color filter 112B facing the color separation device 140 may be increased and the proportion of red in light directed to the red color filters 112R disposed on both sides of the blue color filter 112B may be increased.

For example, referring to FIG. 13, light denoted by ① pass through the color separation device 140 without a change in the propagation direction thereof and then reaches the blue color filter 112B. The propagation direction of light denoted by ② is changed to directions inclined toward edges of the color separation device 140 so that the light denoted by ① may reach the red color filters 112R disposed on both sides of the blue color filter 112B.

Figure 14:
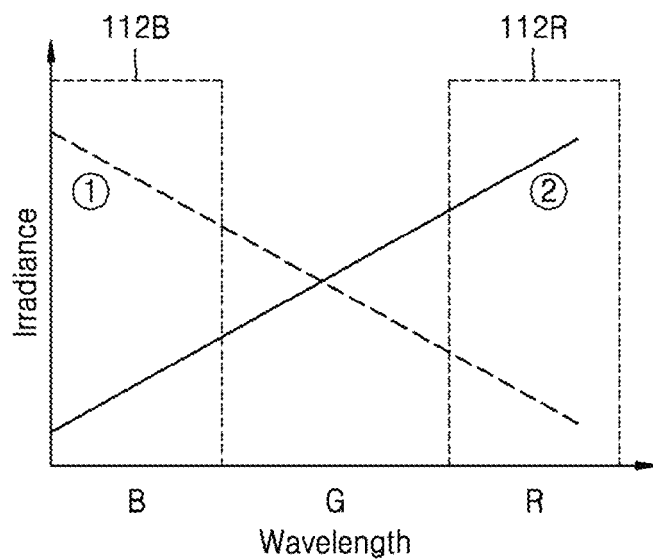

FIG. 14 is a graph schematically illustrating color-separation spectrums by the color separation device 140, wherein spectrums of light denoted by ① and ② are shown.

Referring to FIG. 14, if general white light is incident on the color separation device 140, the proportion of a blue wavelength in light denoted by ① may be increased while passing through the color separation device 140, and the proportion of a red wavelength in light denoted by ② may be increased while passing through the color separation device 140.

In FIG. 14, a dash-line box denoted by 112R refers to an exemplary transmission band of the red color filters 112R, and a dash-line box denoted by 112B refers to an exemplary transmission band of the blue color filter 112B.

According to example embodiments, like in a pixel structure of the related art, the green color filters 112G transmit about 33% of incident light toward the light detecting devices 111. However, because light incident on the blue color filters 112B and the red color filters 112R has high proportions of colors corresponding to the blue color filter 112B and the red color filters 112R, each of the blue color filters 112B and the red color filters 112R transmits a greater portion of incident light compared to the case of a pixel structure of the related art. For example, each of the blue color filters 112B and the red color filters 112R transmits about 50% or more of incident light toward the light detecting devices 111, and light transmitted to the light detecting devices 111 is photoelectrically converted into electric signals indicating the intensity of light at the pixels 110B and 110R. Therefore, the light use efficiency of the blue color filters 112B and the red color filters 112R is high.

The optical lengths of the color separation devices 140 may be very short in the image sensor 100, and thus it may be difficult to completely separate colors by using only the color separation devices 140. Therefore, it may be difficult to obtain a high degree of color purity by using only the color separation devices 140. However, according to example embodiments, the color separation devices 140 and the color filters 112B and 112R are combined so as to obtain a certain degree of color separation effect by using the color separation devices 140 and a high degree of color purity by using the color filters 112B and 112R. Therefore, the amount of light absorbed by the color filters 112B and 112R may be reduced in order to improve the light use efficiency, and along with this, a high degree of color purity may be obtained.

Figure 15:
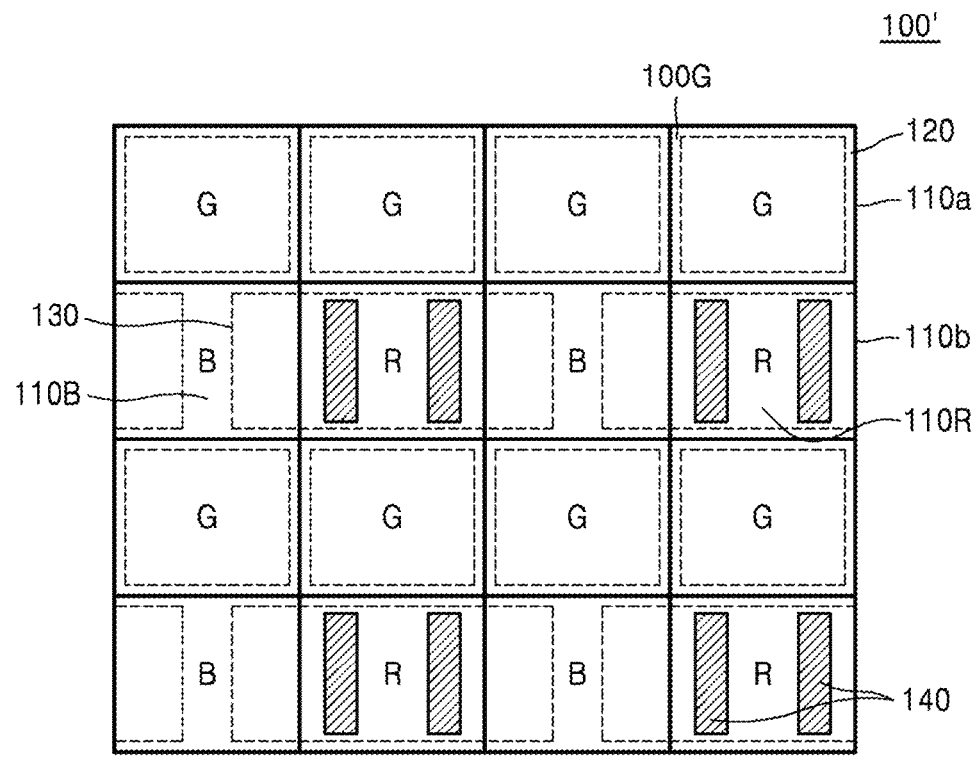

FIG. 15 is a plan view schematically illustrating a pixel structure of an image sensor according to other example embodiments.

Compared to the image sensor 100 illustrated in FIG. 11, image sensor 100' illustrated in FIG. 15 is different in that color separation devices 140 are disposed in red pixels 110R and microlenses 130 are centered on the red pixels 110R. The other structures of the image sensor 100' of FIG. 15 may be the same as those of the image sensor 100 of FIG. 11.

That is, each of the microlenses 130 may extend from a region of a red pixel 110R to some regions of blue pixels 110B disposed on both sides of the red pixel 110R. For example, each of the microlenses 130 may be centered on a red pixel 110R and may extend to about halves of blue pixels 110B disposed on both sides of the red pixel 110R. Therefore, light incident on a red pixels 110R and some regions of blue pixel 110B located on both sides of the red pixels 110R may be concentrated by a microlens 130 and may pass through a color separation device 140.

Each of the color separation devices 140 may be configured to change the spectrum distribution of incident light in such a manner that the proportion of red in light directed to a red color filter 112R facing the color separation device 140 may be increased and the proportion of blue in light directed to blue color filters 112B disposed on both sides of the red color filter 112R may be increased. For example, light passing through the color separation device 140 without a change in the propagation direction thereof reaches the red color filter 112R, and light whose propagation direction is changed to directions inclined toward edges of the color separation device 140 reaches the blue color filters 112B disposed on both sides of the red color filter 112R. In this case, the color separation device 140 may be configured such that light reaching the red color filter 112R may have a spectrum denoted by ② in FIG. 14 and light reaching the blue color filter 112B may have a spectrum denoted by ① in FIG. 14.

Figure 16:
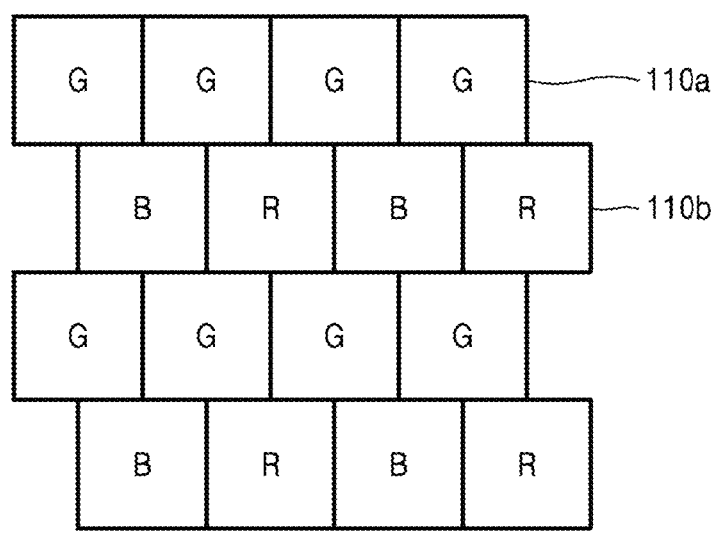

FIG. 16 is a plan view schematically illustrating a pixel structure of an image sensor according to further example embodiments.

In the image sensors 100 and 100' illustrated in FIGS. 11 and 15, the first and second pixel rows 110a and 110b are aligned with each other. In the image sensor illustrated in FIG. 16, however, first and second pixel rows 110a and 110b may be shifted relative to each other. For example, pixels of the first pixel rows 110a may be shifted related to pixels of the second pixel rows 110b by half the width of the pixels. Although not shown in FIG. 16, color separation devices 140 may be arranged to face blue color filters 112B or red color filters 112R of the second pixel rows 110b. Therefore in the example embodiments illustrated in FIG. 16, each of the color separation devices 140 may be disposed between two neighboring green pixels 110G of the first pixel rows 110a. In this case, although a spectrum change caused by the color separation devices 140 in the second pixel rows 110b may have influence on the first pixel rows 110a, the influence may be uniform in all the green pixels 110G of the first pixel rows 110a.

Figure 17:
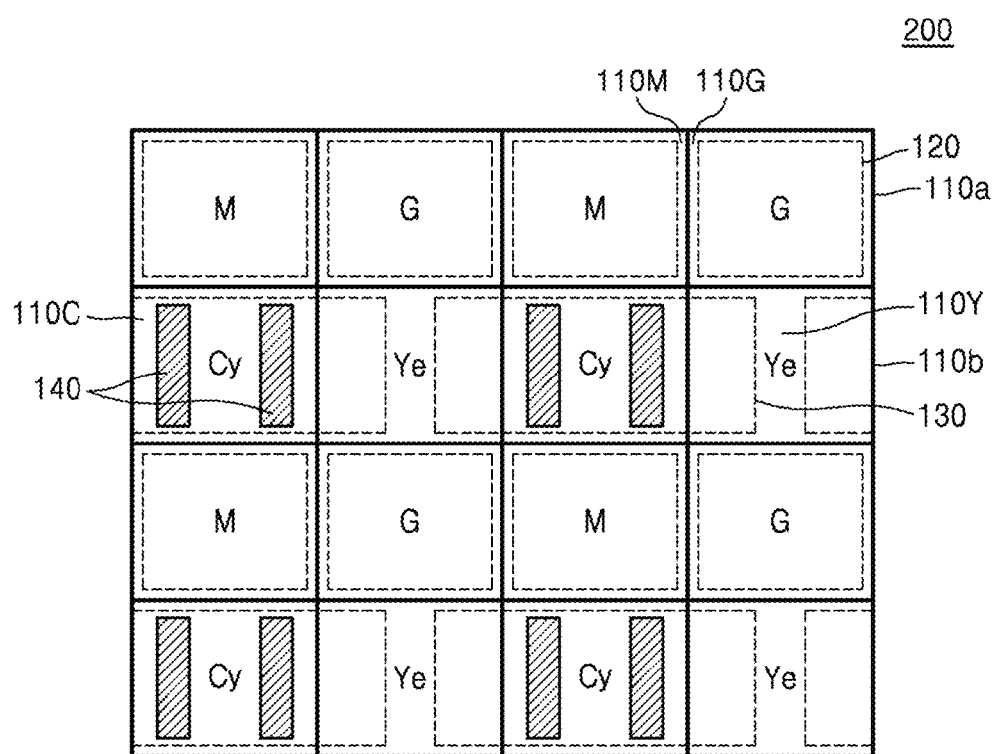

FIG. 17 is a plan view schematically illustrating a pixel structure of an image sensor according to still other example embodiments.

An image sensor 200 illustrated in FIG. 17 uses a CYGM color filter format having cyan (Cy), yellow (Ye), green (G), and magenta (M) color filters, instead of using a RGB color filter format described above.

Referring to FIG. 17, a plurality of magenta pixels 110M and a plurality of green pixels 110G may be alternately arranged in first pixel rows 110a. In addition, a plurality of cyan pixels 110C and a plurality of yellow pixels 110Y may be alternately arranged in second pixel rows 110b. Furthermore, color separation devices 140 may be disposed in regions of the cyan pixels 110C, and microlenses 130 may be centered on the cyan pixels 110C.

For example, each of the microlenses 130 may extend from a region of a cyan pixel 110C to some regions of yellow pixels 110Y disposed on both sides of the cyan pixel 110C. As shown in FIG. 17, each of the microlenses 130 may be centered on a cyan pixels 110C and may extend to about halves of yellow pixels 110Y disposed on both sides of the cyan pixel 110C. Therefore, light incident on a cyan pixel 110C and some regions of yellow pixels 110Y located on both sides of the cyan pixels 110C may be concentrated by a microlens 130 and may pass through a color separation device 140.

Each of the color separation devices 140 may be configured to increase the proportion of cyan type colors in light directed to a cyan pixel 110C and the proportion of yellow type colors in light directed to yellow pixels 110Y disposed on both sides of the cyan pixel 110C. For example, light passing through a color separation device 140 without a change in the propagation direction thereof may reach a cyan color filter, and light whose propagation direction is changed to directions inclined toward edges of the color separation device 140 may reach yellow color filters disposed on both sides of the cyan color filter. In this case, each of the color separation devices 140 may be configured such that light reaching a cyan color filter may have the spectrum denoted by ① in FIG. 14 and light reaching a yellow color filter may have the spectrum denoted by ② in FIG. 14. In the case of the CYGM color filter format illustrated in FIG. 17, because each color filter transmits lights in a wider wavelength band than RGB color filters, absorption loss may be further reduced, thereby improving the light use efficiency.

Figure 18:
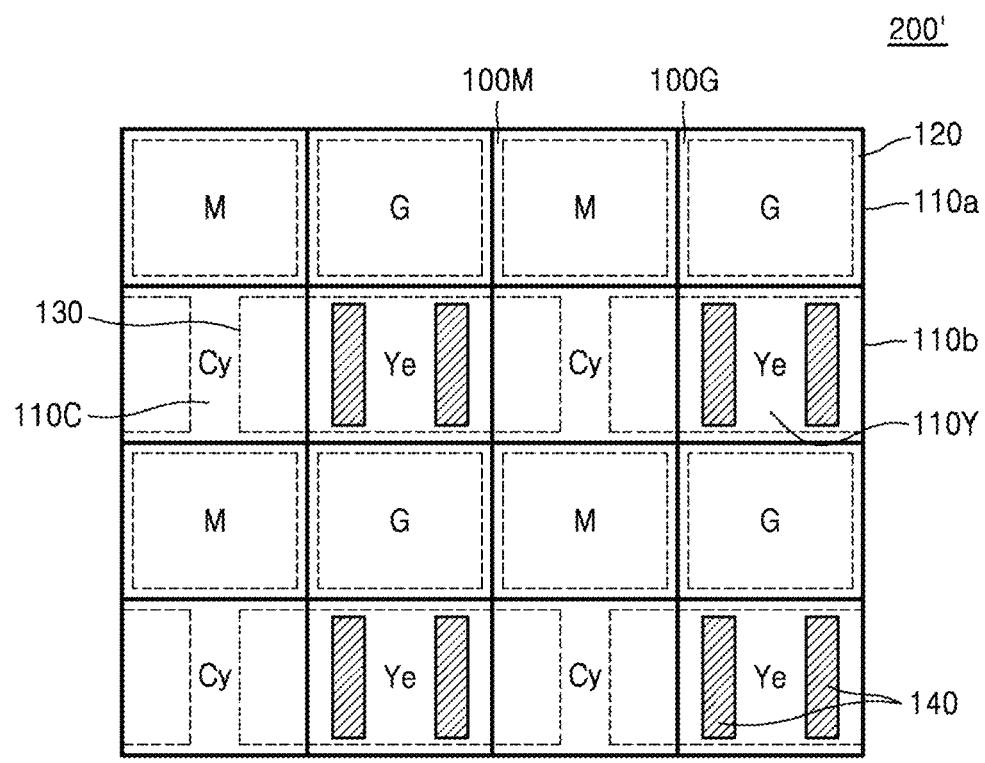

FIG. 18 is a plan view schematically illustrating a pixel structure of an image sensor according to still further example embodiments.

Compared to the image sensor 200 illustrated in FIG. 17, an image sensor 200' illustrated in FIG. 18 is different in that color separation devices 140 are disposed in yellow pixels 110Y and microlenses 130 are centered on the yellow pixels 110Y. Therefore, the color separation devices 140 of the image sensor 200' may be configured to increase the proportion of yellow type colors in light passing through the color separation devices 140 without a change in the propagation direction thereof and the proportion of cyan type colors in light whose propagation direction is changed to directions inclined toward edges of the color separation devices 140. The other structures of the image sensor 200' of FIG. 18 may be the same as those of the image sensor 200 of FIG. 17.

Figure 19:
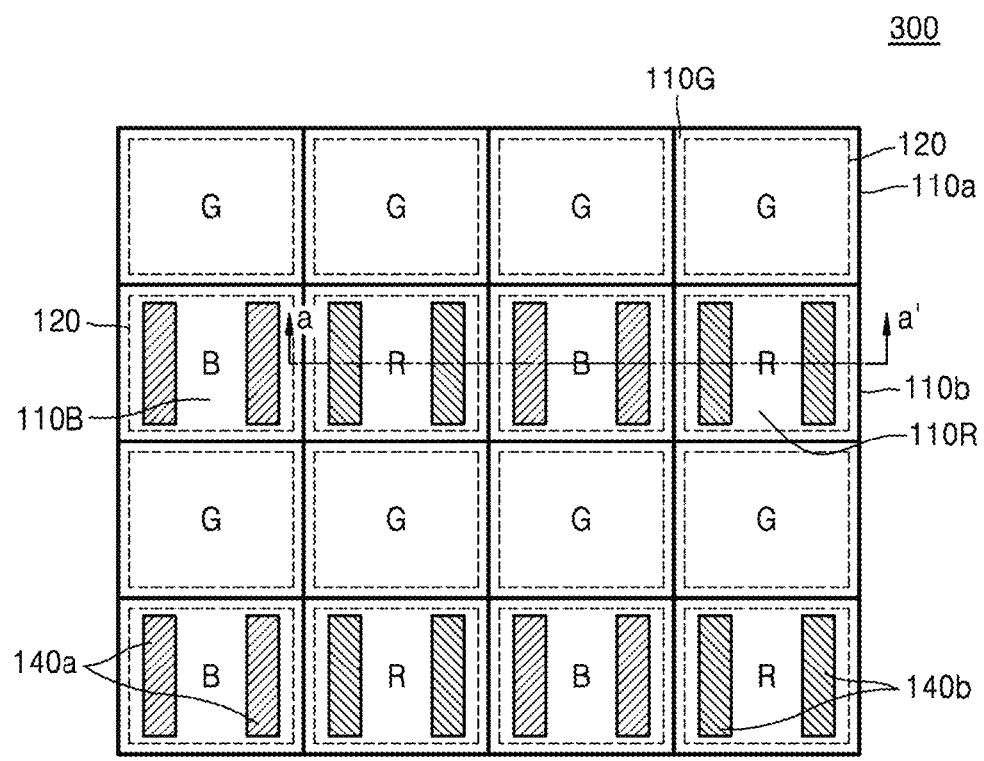

FIG. 19 is a plan view schematically illustrating a pixel structure of an image sensor according to yet still other example embodiments.

Like the image sensor 100 illustrated in FIG. 11, an image sensor 300 illustrated in FIG. 19 may include first pixel rows 110a including a plurality of green pixels 110G, and second pixel rows 110b including a plurality of blue pixels 110B and a plurality of red pixels 110R that are alternately arranged. Compared to the image sensor 100 illustrated in FIG. 11, the image sensor 300 illustrated in FIG. 19 is different in that microlenses 120 and color separation devices 140a and 140b are disposed in the blue pixels 110B and the red pixels 110R, respectively. Therefore, in the image sensor 300 illustrated in FIG. 19, microlenses 120 having the same structure may be used for all the pixels 110R, 110G, and 110B.

Figure 20:
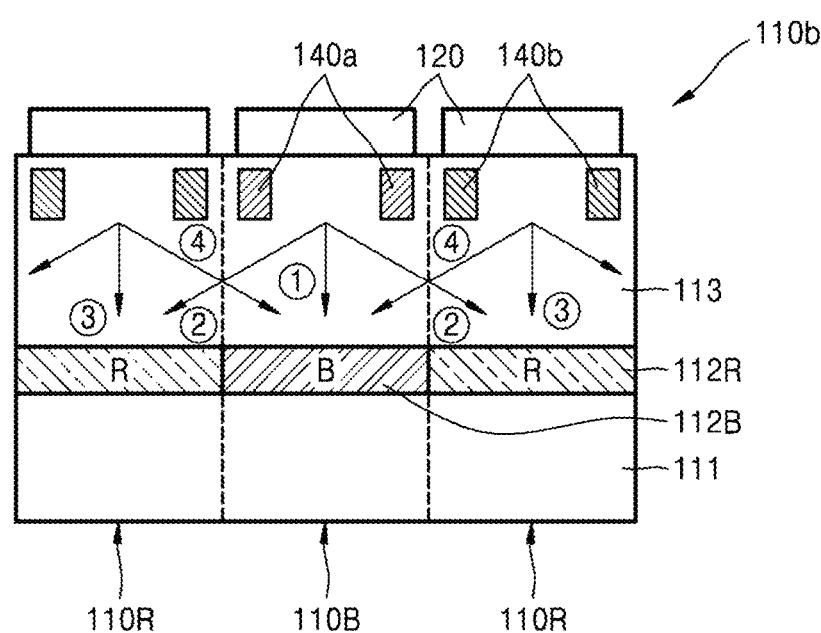

FIG. 20 is a cross-sectional view of a second pixel row of the image sensor taken along line a-a' of FIG. 19.

Referring to FIG. 20, s second pixel row 110b may include a plurality of light detecting devices 111 arranged adjacent to each other, a plurality of red color filters 112R and a plurality of blue color filters 112B alternately arranged on light entrance surfaces of the light detecting devices 111, a transparent spacer 113 disposed to cover the red color filters 112R and the blue color filters 112B, a plurality of first color separation devices 140a disposed in the transparent spacer 113 to face the blue color filters 112B, a plurality of second color separation devices 140b disposed in the transparent spacer 113 to face the red color filters 112R, and a plurality of microlenses 120 disposed on the transparent spacer 113 to concentrate incident light on the respective light detecting devices 111. The microlenses 120 may be respectively arranged to face the red color filters 112R and the blue color filters 112B. The transparent spacer 113 may extend across all of the alternating red and blue color filters 112R and 112B.

Each of the first color separation devices 140a may be configured to change the spectrum distribution of incident light in such a manner that the proportion of blue in light directed to a blue color filter 112B facing the color separation device 140a may be increased and the proportion of red in light directed to red color filters 112R disposed on both sides of the blue color filter 112B may be increased. Each of the second color separation devices 140b may be configured to change the spectrum distribution of incident light in such a manner that the proportion of red in light directed to a red color filter 112R facing the color separation device 140b may be increased and the proportion of blue in light directed to blue color filters 112B disposed on both sides of the red color filters 112R may be increased. For example, light passing through a first color separation device 140a and propagating in a direction denoted by ① may have the spectrum distribution denoted by ① in FIG. 14, and light passing through the first color separation device 140a and propagating in directions denoted by ② may have the spectrum distribution denoted by ② in FIG. 14. In addition, light passing through a second color separation device 140b and propagating in a direction denoted by ③ may have the spectrum distribution denoted by ② in FIG. 14, and light passing through the second color separation device 140b and propagating in a direction denoted by ④ may have the spectrum distribution denoted by ① in FIG. 14.

Figure 21:
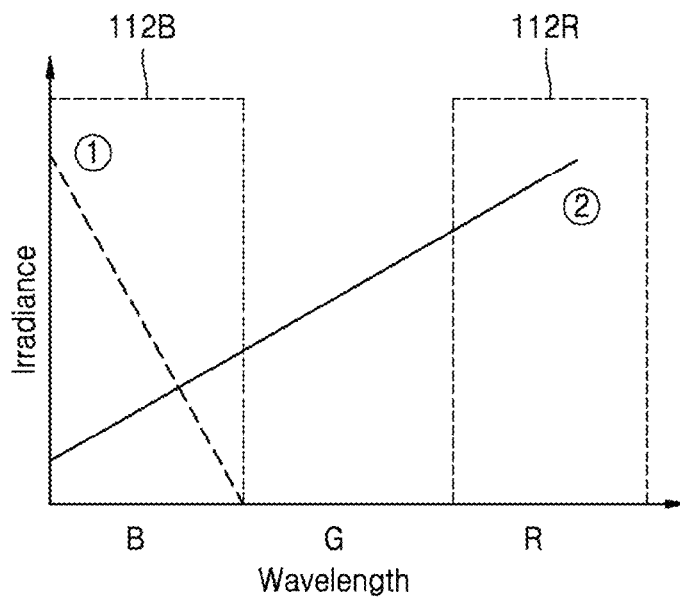
Figure 22:
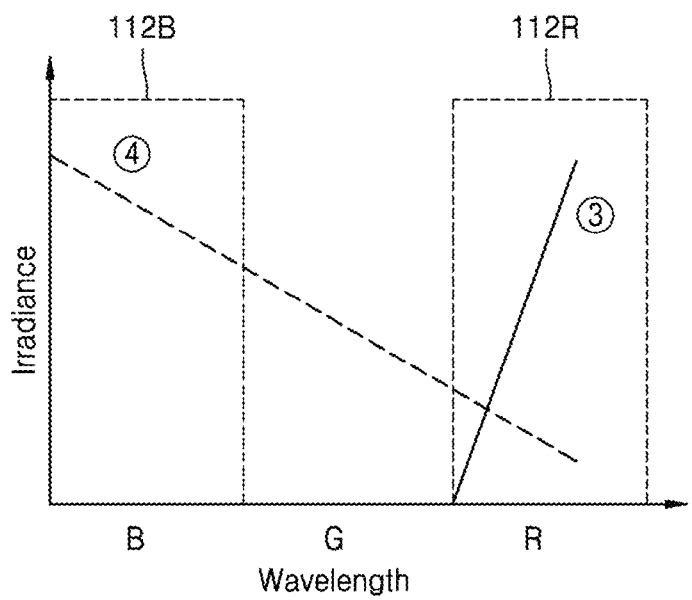

To further improve the light use efficiency of the image sensor 300, the first and second color separation devices may have the color-separation spectrums illustrated in FIGS. 21 and 22.

For example, referring to FIG. 21, most of blue light may be included in light passing through a first color separation device 140a and propagating in a direction denoted by ①. In addition, light passing through the first color separation devices 140a and propagating in a direction denoted by ② may have a spectrum distribution denoted by ② in FIG. 21. In addition, referring to FIG. 22, most of blue light may be included in light passing through a second color separation device 140b and propagating in a direction denoted by ③. In addition, light passing through the second color separation devices 140b and propagating in a direction denoted by ④ may have a spectrum distribution denoted by ④ in FIG. 22.

Figure 23:
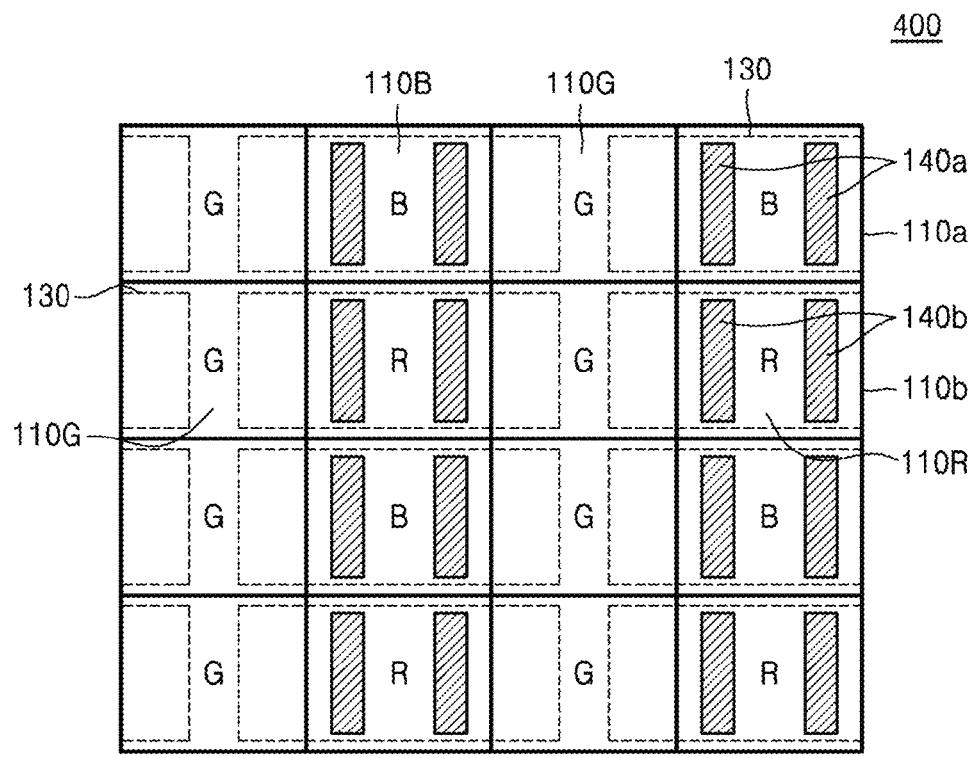

FIG. 23 is a plan view schematically illustrating a pixel structure of an image sensor according to even other example embodiments.

An image sensor 400 illustrated in FIG. 23 may include first pixel rows 110a including a plurality of green pixels 110G and a plurality of blue pixels 110B alternately arranged, second pixel rows 110b including a plurality of green pixels 110G and a plurality of red pixels 110R alternately arranged, a plurality of first color separation devices 140a respectively arranged to face a plurality of blue color filters 112B, and a plurality of second color separation devices 140b respectively arranged to face a plurality of red color filters 112R.

Microlenses 130 having the same structure may be respectively centered on the blue pixels 110B and the red pixels 110R. For example, in each of the first pixel rows 110a, each of the microlenses 130 may be centered on a blue pixel 110B and may extend to some regions of green pixels 110G disposed on both sides of the blue pixel 110B. Therefore, light incident on the blue pixels 110B and the green pixels 110G located on both sides of the blue pixels 110B may be concentrated by the microlenses 130 of the first pixel rows 110a and may pass through the first color separation devices 140a. Furthermore, in each of the second pixel rows 110b, each of the microlenses 130 may be centered on a red pixel 110R and may extend to some regions of green pixels 110G disposed on both sides of the blue pixel 110B. Therefore, light incident on the red pixels 110R and the green pixels 110G located on both sides of the red pixels 110R may be concentrated by the microlenses 130 of the second pixel rows 110a and may pass through the second color separation devices 140b.

Each of the first color separation devices 140a may be configured to change the spectrum distribution of incident light in such a manner that the proportion of blue in light directed to a blue pixel 110B facing the first color separation device 140a may be increased and the proportion of green in light directed to green pixels 110G disposed on both sides of the blue pixel 110B may be increased. In addition, each of the second color separation devices 140b may be configured to change the spectrum distribution of incident light in such a manner that the proportion of red in light directed to a red pixel 110R facing the second color separation device 140b may be increased and the proportion of green in light directed to green pixels 110G disposed on both sides of the red pixel 110R may be increased. For example, light passing through the first color separation devices 140a and propagating toward the blue pixels 110B may have the spectrum distribution denoted by ① in FIG. 14, and light passing through the first color separation devices 140a and propagating toward the green pixels 110G may have the spectrum distribution denoted by ② in FIG. 14. In addition, light passing through the second color separation devices 140b and propagating toward the red pixels 110R may have the spectrum distribution denoted by ② in FIG. 14, and light passing through the second color separation devices 140b and propagating toward the green pixels 110G may have the spectrum distribution denoted by ① in FIG. 14. Therefore, the image sensor 400 of the current example embodiments may have improved light use efficiency even for green light.

Figure 24:
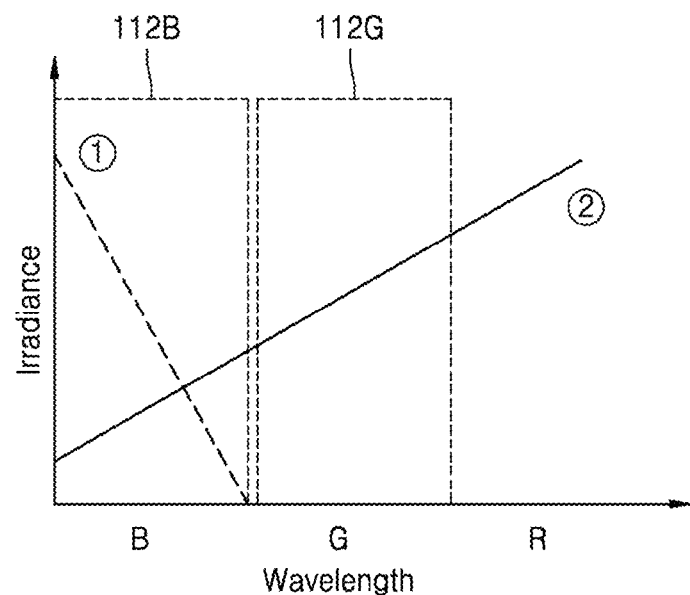
Figure 25:
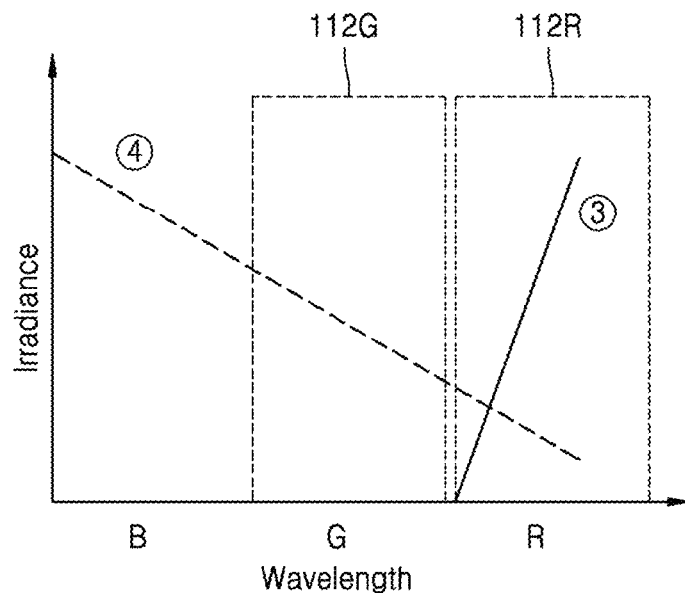

To further improve the light use efficiency of the image sensor 400, the first and second color separation devices 140a and 140b may have color-separation spectrums illustrated in FIGS. 24 and 25. For example, referring to FIG. 24, light passing through the first color separation devices 140a and propagating toward the blue pixels 110B may have a spectrum distribution denoted by ①, and light passing through the first color separation devices 140a and propagating toward the green pixels 110G may have a spectrum distribution denoted by ②. In addition, referring to FIG. 25, light passing through the second color separation devices 140b and propagating toward the red pixels 110R may have a spectrum distribution denoted by ③, and light passing through the second color separation devices 140b and propagating toward the green pixels 110G may have a spectrum distribution denoted by ④. In FIGS. 24 and 25, a dash-line box denoted by 112R refers to an exemplary transmission band of the red color filters 112R, a dash-line box denoted by 112B refers to an exemplary transmission band of the blue color filters 112B, and dash-line boxes denoted by 112G refer to an exemplary transmission band of the green color filters 112G.

Figure 26:
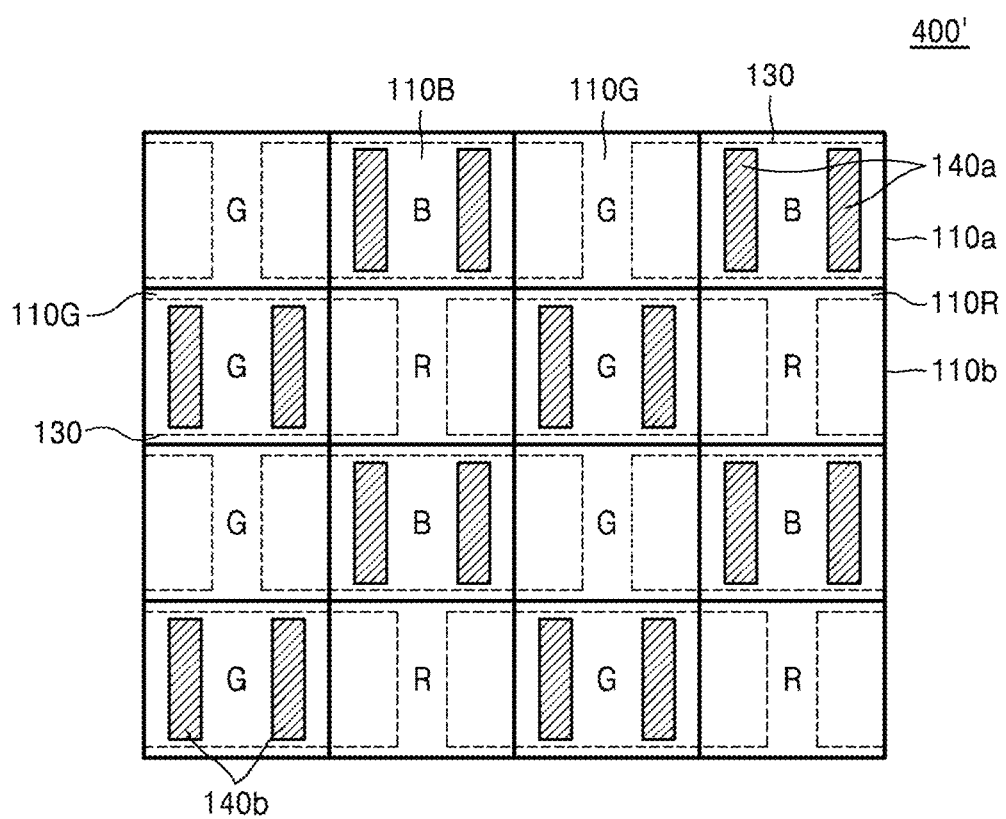

FIG. 26 is a plan view schematically illustrating a pixel structure of an image sensor according to even further example embodiments.

An image sensor 400' illustrated in FIG. 26 may include first pixel rows 110a including a plurality of green pixels 110G and a plurality of blue pixels 110B alternately arranged, second pixel rows 110b including a plurality of green pixels 110G and a plurality of red pixels 110R alternately arranged, a plurality of first color separation devices 140a arranged to face a plurality of blue color filters 112B, respectively, and a plurality of second color separation devices 140b arranged to face a plurality of green color filters 112G, respectively. Compared to the image sensor 400 illustrated in FIG. 25, the image sensor 400' illustrated in FIG. 26 is different in that the second color separation devices 140b are disposed in green pixels 110G. Furthermore, in the second pixel rows 110b, microlenses 130 may be centered on green pixels 110G and may extend to some regions of red pixels 110R disposed on both sides of the green pixels 110G.

Each of the first color separation devices 140a may increase the proportion of blue in light directed to a blue pixel 110B facing the first color separation device 140a and the proportion of green in light directed to green pixels 110G disposed on both sides of the blue pixel 110B. In addition, each of the second color separation devices 140b may increase the proportion of green in light directed to a green pixel 110G facing the second color separation device 140b and the proportion of red in light directed to red pixels 110R disposed on both sides of the green pixel 110G. In the current example embodiments, the first and second color separation devices 140a and 140b may have the same structure. For example, light passing through the first color separation devices 140a and propagating toward the blue pixels 110B may have the spectrum distribution denoted by ① in FIG. 14, and light passing through the first color separation devices 140a and propagating toward the green pixels 110G may have the spectrum distribution denoted by ② in FIG. 14. In addition, light passing through the second color separation devices 140b and propagating toward the green pixels 110G may have the spectrum distribution denoted by ① in FIG. 14, and light passing through the second color separation devices 140b and propagating toward the red pixels 110R may have the spectrum distribution denoted by ② in FIG. 14.

Generally, if a color separation device is configured to transmit short-wavelength light forward and long-wavelength light toward edges, the color separation device may operate efficiently compared to the opposite case. Therefore, the image sensor 400' in which the second color separation devices 140b are disposed in the green pixels 110G of the second pixel rows 110b may have further improved light use efficiency.

The first and second color separation devices 140a and 140b may have different structures. For example, light passing through the first color separation devices 140a and propagating toward the blue pixels 110B may have a spectrum distribution denoted by ① in FIG. 24, and light passing through the first color separation devices 140a and propagating toward the green pixels 110G may have a spectrum distribution denoted by ② in FIG. 24. In addition, light passing through the second color separation devices 140b and propagating toward the green pixels 110G may have a spectrum distribution denoted by ④ in FIG. 25, and light passing through the second color separation devices 140b and propagating toward the red pixels 110R may have a spectrum distribution denoted by ③ in FIG. 25.

As described above, according to the one or more of the above example embodiments, because the color separation devices have a structure in which a plurality of elements are combined, the diffraction pattern of light and the separation angles of colors of light may be easily controlled using the color separation devices compared to the case when color separation devices of the related art having a single structure are used. Therefore, the color separation devices enable effective color separation substantially not affected by crosstalk, and owing to a short color separation path, the color separation devices may be applied to image sensors having small pixels. In addition, since the color separation devices of the example embodiments have a symmetric structure, the color separation devices may be easily manufactured.

Furthermore, in the image sensors of the example embodiments, colors of incident light are mostly separated using the color separation devices and are then directed to the color filters. Therefore, the proportion of light passing through the color filters may be increased. For example, because more red or reddish light is distributed to a red color filter and more blue or bluish light is distributed to a blue color filter, about 33% or more of incident light may pass through the color filters. Therefore, even though the color filters are used, light may be efficiently used and high color purity may be provided.

The color separation device and the image sensor including the color separation device have been described according to the example embodiments with reference to the accompanying drawings. However, it should be understood that the example embodiments described therein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope of the disclosure as defined by the following claims.

What is claimed is:

1. An image sensor, comprising:
   a plurality of first pixels detecting light having a first wavelength band;
   a plurality of second pixels detecting light having a second wavelength band;
   a plurality of third pixels detecting light having a third wavelength band; and
   a plurality of first color separation devices respectively in the second pixels,
   wherein each of the first color separation devices comprises:
      a first transparent bar; and
      a second transparent bar facing the first transparent bar,
   wherein mutually-facing surfaces of the first transparent bar and the second transparent bar are separated from each other by a gap such that the first transparent bar and the second transparent bar allow diffraction of visible light passing therebetween,
   wherein the first transparent bar and the second transparent bar are arranged such that the first transparent bar and the second transparent bar operate as a single color separator changing a spectrum distribution of incident light,
   wherein the first transparent bar and the second transparent bar are connected to each other through edges thereof extending perpendicular to the mutually-facing surfaces of the first transparent bar and the second transparent bar,
   wherein a shape of a first end of the color separation device is identical to a shape of a second end of the color separation device, the second end of the color separation device being opposite to the first end of the color separation device, and
   wherein the color separation device is configured to change the spectrum distribution of the incident light which travels from the first end of the color separation device to the second end of the color separation device.

2. The image sensor of claim 1, wherein
   the plurality of first pixels are arranged a first pixel row,
   the plurality of second pixels and the plurality of third pixels are alternately arranged in a second pixel row, and
   the second pixel row is adjacent to the first pixel row.

3. The image sensor of claim 2, wherein each of the plurality of first color separation devices is configure to change a spectrum distribution of incident light so as to increase a first proportion of light of the second wavelength band incident on the second pixels and a first proportion of light of the third wavelength band incident on the third pixels.

4. The image sensor of claim 3, further comprising a plurality of second color separation devices respectively in the third pixels, each of the plurality of second color separation devices changing a spectrum distribution of incident light so as to increase a second proportion of light of the third wavelength band incident on the third pixels and a second proportion of light of the second wavelength band incident on the second pixels.

5. The image sensor of claim 4, wherein each of the plurality of second color separation devices is configured to transmit light of the third wavelength band in a forward direction toward the third pixels and to refract light of the second wavelength band to edges toward the second pixels on both sides of the third pixels.

6. The image sensor of claim 2, further comprising a plurality of fourth pixels detecting light having a fourth wavelength band,
   wherein the plurality of first pixels and the plurality of fourth pixels are alternately arranged in the first pixel row.

7. The image sensor of claim 1, wherein
   the plurality of first pixels and the plurality of second pixels are alternately arranged in a first pixel row,
   the plurality of first pixels and the plurality of third pixels are alternately arranged in a second pixel row, and
   the second pixel row is adjacent to the first pixel row.

8. The image sensor of claim 7, wherein each of the plurality of first color separation devices is configured to change a spectrum distribution of incident light so as to increase a proportion of light of the second wavelength band incident on the second pixels and a proportion of light of the first wavelength band incident on the first pixels.

9. The image sensor of claim 8, further comprising a plurality of second color separation devices respectively in the third pixels, each of the plurality of second color separation devices changing a spectrum distribution of incident light so as to increase a first proportion of light of the third wavelength band incident on the third pixels and a first proportion of light of the first wavelength band incident on the first pixels.

10. The image sensor of claim 9, wherein each of the plurality of first color separation devices configured to transmit light of the second wavelength band in a forward direction toward the second pixels and to refract light of the first wavelength band to edges toward the first pixels disposed on both sides of the second pixels, and
    each of the plurality of second color separation devices configured to transmit light of the third wavelength band in a forward direction toward the third pixels and to refract light of the first wavelength band to edges toward the first pixels disposed on both sides of the third pixels.

11. The image sensor of claim 7, wherein each of the plurality of first color separation devices configured to change a spectrum distribution of incident light so as to increase a proportion of light of the second wavelength band incident on the second pixels and a first proportion of light of the first wavelength band incident on the first pixels.

12. The image sensor of claim 11, further comprising a plurality of second color separation devices respectively in the first pixels of the second pixel row, each of the plurality of second color separation devices changing a spectrum distribution of incident light so as to increase a second proportion of light of the first wavelength band incident on the first pixels and a proportion of light of third wavelength band incident on the third pixels.

13. An image sensor, comprising:
    a plurality of first pixels detecting light having a first wavelength band;
    a plurality of second pixels detecting light having a second wavelength band;
    a plurality of third pixels detecting light having a third wavelength band; and
    a plurality of first color separation devices respectively in the second pixels,
    wherein each of the first color separation devices comprises:
       a first transparent bar;
       a second transparent bar facing the first transparent bar; and a third transparent bar facing the second transparent bar,
wherein mutually-facing surfaces of the first transparent bar and the second transparent bar are separated from each other by a gap such that the first transparent bar and the second transparent bar allow diffraction of visible light passing therebetween,
wherein mutually-facing surfaces of the second transparent bar and the third transparent bar are separated from each other by a gap such that the second transparent bar and the third transparent bar allow diffraction of visible light passing therebetween,
wherein the first transparent bar, the second transparent bar, and the third transparent bar are arranged such the first transparent bar, the second transparent bar, and the third transparent bar operate as a single color separator changing a spectrum distribution of incident light,
wherein a shape of a first end of the color separation device is identical to a shape of a second end of the color separation device, the second end of the color separation device being opposite to the first end of the color separation device, and
wherein the color separation device is configured to change the spectrum distribution of the incident light which travels from the first end of the color separation device to the second end of the color separation device.

14. The image sensor of claim 13, wherein the first transparent bar and the second transparent bar are connected to each other through edges thereof extending perpendicular to the mutually-facing surfaces of the first transparent bar and the second transparent bar, and
wherein the second transparent bar and the third transparent bar are connected to each other through edges thereof extending perpendicular to the mutually-facing surfaces of the second transparent bar and the third transparent bar.

15. The color separation device of claim 13, wherein the first transparent bar and the second transparent bar are connected to each other through center portions thereof extending perpendicular to the mutually-facing surfaces of the first transparent bar and the second transparent bar, and
wherein the second transparent bar and the third transparent bar are connected to each other through center portions thereof extending perpendicular to the mutually-facing surfaces of the second transparent bar and the third transparent bar.

16. The image sensor of claim 13, wherein
the plurality of first pixels are arranged a first pixel row,
the plurality of second pixels and the plurality of third pixels are alternately arranged in a second pixel row, and
the second pixel row is adjacent to the first pixel row.

17. The image sensor of claim 16, wherein each of the plurality of first color separation devices is configure to change a spectrum distribution of incident light so as to increase a first proportion of light of the second wavelength band incident on the second pixels and a first proportion of light of the third wavelength band incident on the third pixels.

18. The image sensor of claim 17, further comprising a plurality of second color separation devices respectively in the third pixels, each of the plurality of second color separation devices changing a spectrum distribution of incident light so as to increase a second proportion of light of the third wavelength band incident on the third pixels and a second proportion of light of the second wavelength band incident on the second pixels.

19. The image sensor of claim 18, wherein each of the plurality of second color separation devices is configured to transmit light of the third wavelength band in a forward direction toward the third pixels and to refract light of the second wavelength band to edges toward the second pixels on both sides of the third pixels.

20. The image sensor of claim 13, wherein
the plurality of first pixels and the plurality of second pixels are alternately arranged in a first pixel row,
the plurality of first pixels and the plurality of third pixels are alternately arranged in a second pixel row, and
the second pixel row is adjacent to the first pixel row.

21. The image sensor of claim 20, wherein each of the plurality of first color separation devices configured to change a spectrum distribution of incident light so as to increase a proportion of light of the second wavelength band incident on the second pixels and a first proportion of light of the first wavelength band incident on the first pixels.

22. The image sensor of claim 21, further comprising a plurality of second color separation devices respectively in the first pixels of the second pixel row, each of the plurality of second color separation devices changing a spectrum distribution of incident light so as to increase a second proportion of light of the first wavelength band incident on the first pixels and a proportion of light of third wavelength band incident on the third pixels.

23. The image sensor of claim 20, wherein each of the plurality of first color separation devices is configured to change a spectrum distribution of incident light so as to increase a proportion of light of the second wavelength band incident on the second pixels and a proportion of light of the first wavelength band incident on the first pixels.

24. The image sensor of claim 23, further comprising a plurality of second color separation devices respectively in the third pixels, each of the plurality of second color separation devices changing a spectrum distribution of incident light so as to increase a first proportion of light of the third wavelength band incident on the third pixels and a first proportion of light of the first wavelength band incident on the first pixels.

25. The image sensor of claim 24, wherein each of the plurality of first color separation devices configured to transmit light of the second wavelength band in a forward direction toward the second pixels and to refract light of the first wavelength band to edges toward the first pixels disposed on both sides of the second pixels, and
each of the plurality of second color separation devices configured to transmit light of the third wavelength band in a forward direction toward the third pixels and to refract light of the first wavelength band to edges toward the first pixels disposed on both sides of the third pixels.

26. An image sensor, comprising:
a plurality of first pixels detecting light having a first wavelength band;
a plurality of second pixels detecting light having a second wavelength band;
a plurality of third pixels detecting light having a third wavelength band; and
a plurality of first color separation devices respectively in the second pixels,
wherein each of the first color separation devices comprises:
a first transparent bar; and
a second transparent bar facing the first transparent bar, wherein portions of the first transparent bar and the second transparent bar are connected to each other, and perpendicularly intersect each other, and wherein the first transparent bar and the second transparent bar are arranged such that the first transparent bar and the second transparent bar operate as a single color separator changing a spectrum distribution of incident light, wherein a shape of a first end of the color separation device is identical to a shape of a second end of the color separation device, the second end of the color separation device being opposite to the first end of the color separation device, and wherein the color separation device is configured to change the spectrum distribution of the incident light which travels from the first end of the color separation device to the second end of the color separation device.

27. The image sensor of claim 26, wherein
the plurality of first pixels are arranged a first pixel row,
the plurality of second pixels and the plurality of third pixels are alternately arranged in a second pixel row, and
the second pixel row is adjacent to the first pixel row.

28. The image sensor of claim 27, wherein each of the plurality of first color separation devices is configure to change a spectrum distribution of incident light so as to increase a first proportion of light of the second wavelength band incident on the second pixels and a first proportion of light of the third wavelength band incident on the third pixels.

29. The image sensor of claim 28, further comprising a plurality of second color separation devices respectively in the third pixels, each of the plurality of second color separation devices changing a spectrum distribution of incident light so as to increase a second proportion of light of the third wavelength band incident on the third pixels and a second proportion of light of the second wavelength band incident on the second pixels.

30. The image sensor of claim 29, wherein each of the plurality of second color separation devices is configured to transmit light of the third wavelength band in a forward direction toward the third pixels and to refract light of the second wavelength band to edges toward the second pixels on both sides of the third pixels.

31. The image sensor of claim 26, wherein
the plurality of first pixels and the plurality of second pixels are alternately arranged in a first pixel row,
the plurality of first pixels and the plurality of third pixels are alternately arranged in a second pixel row, and
the second pixel row is adjacent to the first pixel row.

32. The image sensor of claim 31, wherein each of the plurality of first color separation devices is configured to change a spectrum distribution of incident light so as to increase a proportion of light of the second wavelength band incident on the second pixels and a proportion of light of the first wavelength band incident on the first pixels.

33. The image sensor of claim 32, further comprising a plurality of second color separation devices respectively in the third pixels, each of the plurality of second color separation devices changing a spectrum distribution of incident light so as to increase a first proportion of light of the third wavelength band incident on the third pixels and a first proportion of light of the first wavelength band incident on the first pixels.

34. The image sensor of claim 33, wherein each of the plurality of first color separation devices configured to transmit light of the second wavelength band in a forward direction toward the second pixels and to refract light of the first wavelength band to edges toward the first pixels disposed on both sides of the second pixels, and each of the plurality of second color separation devices configured to transmit light of the third wavelength band in a forward direction toward the third pixels and to refract light of the first wavelength band to edges toward the first pixels disposed on both sides of the third pixels.

35. The image sensor of claim 31, wherein each of the plurality of first color separation devices configured to change a spectrum distribution of incident light so as to increase a proportion of light of the second wavelength band incident on the second pixels and a first proportion of light of the first wavelength band incident on the first pixels.

36. The image sensor of claim 35, further comprising a plurality of second color separation devices respectively in the first pixels of the second pixel row, each of the plurality of second color separation devices changing a spectrum distribution of incident light so as to increase a second proportion of light of the first wavelength band incident on the first pixels and a proportion of light of third wavelength band incident on the third pixels.

* * * * *